United States Patent
Kim et al.

[11] Patent Number: 6,026,039
[45] Date of Patent: Feb. 15, 2000

[54] PARALLEL TEST CIRCUIT FOR SEMICONDUCTOR MEMORY

[75] Inventors: Du-Eung Kim; Choong-Keun Kwak, both of Kyunggi-do; Yun-Seung Shin, Seoul, all of Rep. of Korea

[73] Assignee: Samsung Electronics Co., Ltd., Kyunggi-do, Rep. of Korea

[21] Appl. No.: 09/215,576

[22] Filed: Dec. 17, 1998

[30] Foreign Application Priority Data

Dec. 20, 1997 [KR] Rep. of Korea ............... 97-71284

[51] Int. Cl.[7] .................................... G11C 7/00

[52] U.S. Cl. ........................... 365/201; 365/230.08

[58] Field of Search .................. 365/201, 230.08, 365/189.05, 230.06

[56] References Cited

U.S. PATENT DOCUMENTS 5,559,744  9/1996  Kuriyama et al. ................. 365/201

*Primary Examiner*—David Nelms
*Assistant Examiner*—David Lam
*Attorney, Agent, or Firm*—Skjerven, Morrill, MacPherson, Franklin & Friel, LLP.; Don C. Lawrence

[57] ABSTRACT

A parallel test circuit for a semiconductor memory device includes multiple data input pads, multiple data input buffers respectively connected to the data input pads for receiving write data in response to a chip selection signal during normal operation, and a switching circuit for electrically connecting the data input pads to each other in response to a current leakage test signal applied to the circuit. The circuit enables the detection of leakage current in the input data buffers at the same time that a parallel data writing test is performed, thereby reducing the total time required to test the device.

6 Claims, 2 Drawing Sheets

PARALLEL TEST CIRCUIT FOR SEMICONDUCTOR MEMORY

BACKGROUND

1. Field of the Invention

The present invention relates to testing of semiconductor devices, and more particularly, to a parallel test circuit for simultaneously testing multiple memory cells in a semiconductor memory device.

2. Related Art

Typically, a plurality of identical integrated circuit (IC) memory devices, each comprising a number of memory cells, are fabricated simultaneously on a semiconductor wafer. The wafer is then separated, typically by sawing or breaking, into individual devices, or "chips," which are then individually packaged for subsequent use.

Typically, each memory device includes a built-in test circuit fabricated on the wafer along with the device to test its operation. Memory devices are generally tested at least twice. A first test at the wafer level detects defective memory cells by connecting detection probes to input/output terminals of the test circuit on the wafer. Defective chips may be discarded, or in some cases, repaired on the wafer.

After the devices have been tested at the wafer-level, they are separated from the wafer, and those passing the first test are incorporated into suitable IC packages, each containing an individual memory device. A second, package-level test is then performed on the packaged devices to determine whether their electrical performance falls within specification. In this test, test signals are applied to the devices through the input pins of the packages, which are connected internally to the input/output pads of the test circuit.

Both the wafer-level and the package-level tests typically employ a "parallel" test method which tests a number of memory cells simultaneously. This procedure is well known in the art, and is described in detail in the book, *Semiconductor Memories: A Handbook of Design, Manufacture, and Application,* 2nd Ed., by Betty Prince; John Wiley & Sons, pp. 698–717, 1991.

There are various ways to reduce the production cost of memory devices. One way is to reduce device testing time, which can be achieved by testing several memory cells simultaneously. Referring to FIG. 1, a conventional parallel test circuit includes a parallel test control circuit 100 and four data input buffers 120, 140, 160 and 180 adapted to receive and write 4-bit input data into a memory cell array of a semiconductor memory device (not shown) in response to a chip select (CS) signal. The test control circuit 100 is connected to a parallel test pad 1, and the four data input buffers 120, 140, 160 and 180 are connected to respective data input pads 2, 3, 4 and 5. The control circuit 100 controls the data input buffers 120, 140, 160 and 180 such that, in response to the application of a "test active" signal MDQ to parallel test pad 1, a "write data" input signal DQ1 of a given level applied to any one of data input pads 2, 3, 4 and 5 alone will generate output data D1, D2, D3 and D4 of an identical level at the outputs of data input buffers 120, 140, 160 and 180, respectively.

More specifically, in the conventional parallel test and test circuit of FIG. 1, an input signal DQ1 of a given level is applied to any one (for example, pad 2) of data input pads 2, 3, 4 and 5, and the other pads 3, 4 and 5 are left "floating." In this state, if a test active signal MDQ of a high level is applied to parallel test pad 1, then a low level signal will be applied through the inverters 10, 11 and 12 to one of the input terminals of each of the four NAND gates 17, 21, 25 and 29. Thus, even though data input pads 3, 4 and 5 are floating, the outputs of the NAND gates 17, 21, 25 and 29 will all be at a high level. Therefore, the level of the test input signal DQ1 applied to data input pad 2 determines the output of NAND gate 14, and since this output level is sent as an input to the NAND gates 18, 22, 26 and 30, the outputs D1, D2, D3 and D4 of NAND gates 18, 22, 26 and 30, respectively, will have the same level as that of the buffer 120 in response to the test input to data input pad 2. This parallel test is thus capable of checking the write operation of all four data input pads 2, 3, 4 and 5 at the same time by inputting write data DQ1 to only one data input pad 2, thereby reducing the time required to test all of the pads when tested one at a time.

However, it may also be noted that, while such a parallel test can also simultaneously check the current leakage of the data input buffer 120 associated with the data input pad 2, it cannot simultaneously test the current leakage of the other data input buffers 140, 160 and 180 associated with input pads 3, 4 and 5, respectively, due to the fact that the latter pads are floating. Therefore, in order to check the current leakage of each of these other data input pads and buffers, a separate, additional current leakage test must be performed on each pad, which somewhat offsets the economy achieved by the parallel data writing test of the memory cells described above.

It is therefore desirable to be able to test both the write operation and the current leakage of the data input pads and buffers simultaneously and in parallel.

SUMMARY OF THE INVENTION

The present invention provides a parallel test circuit for a semiconductor memory device that includes means for testing both the write operation and the current leakage of the data input pads and buffers of the device simultaneously and in parallel.

According to one embodiment of this invention, the test circuit includes multiple data input pads, multiple data input buffers respectively connected to the data input pads for receiving input data in response to a chip selection signal during normal operation of the device, and a switching circuit for electrically connecting the data input pads to each other in response to a current leakage test signal applied during a parallel test mode of the circuit.

In another aspect, the invention includes a parallel test pad for receiving a parallel test active signal to activate the parallel test mode of the circuit, and a parallel test control circuit connected to the parallel test pad which, in response to the parallel test active signal, causes the data input buffers to simultaneously generate data outputs at the same level as that generated by any one of the data input buffers to which write data of a given level has been applied.

A better understanding of the invention and its many attendant advantages may be had from a consideration of the detailed description of its preferred embodiments below, particularly if consideration is also given to the figures in the accompanying drawings. Following is a brief description of those drawings.

BRIEF DESCRIPTION OF THE DRAWINGS

It should be noted that, in the above figures, similar or identical items are indicated by the same symbols and reference numerals.

DETAILED DESCRIPTION OF THE PREFERRED EMBODIMENTS

Figure 2:
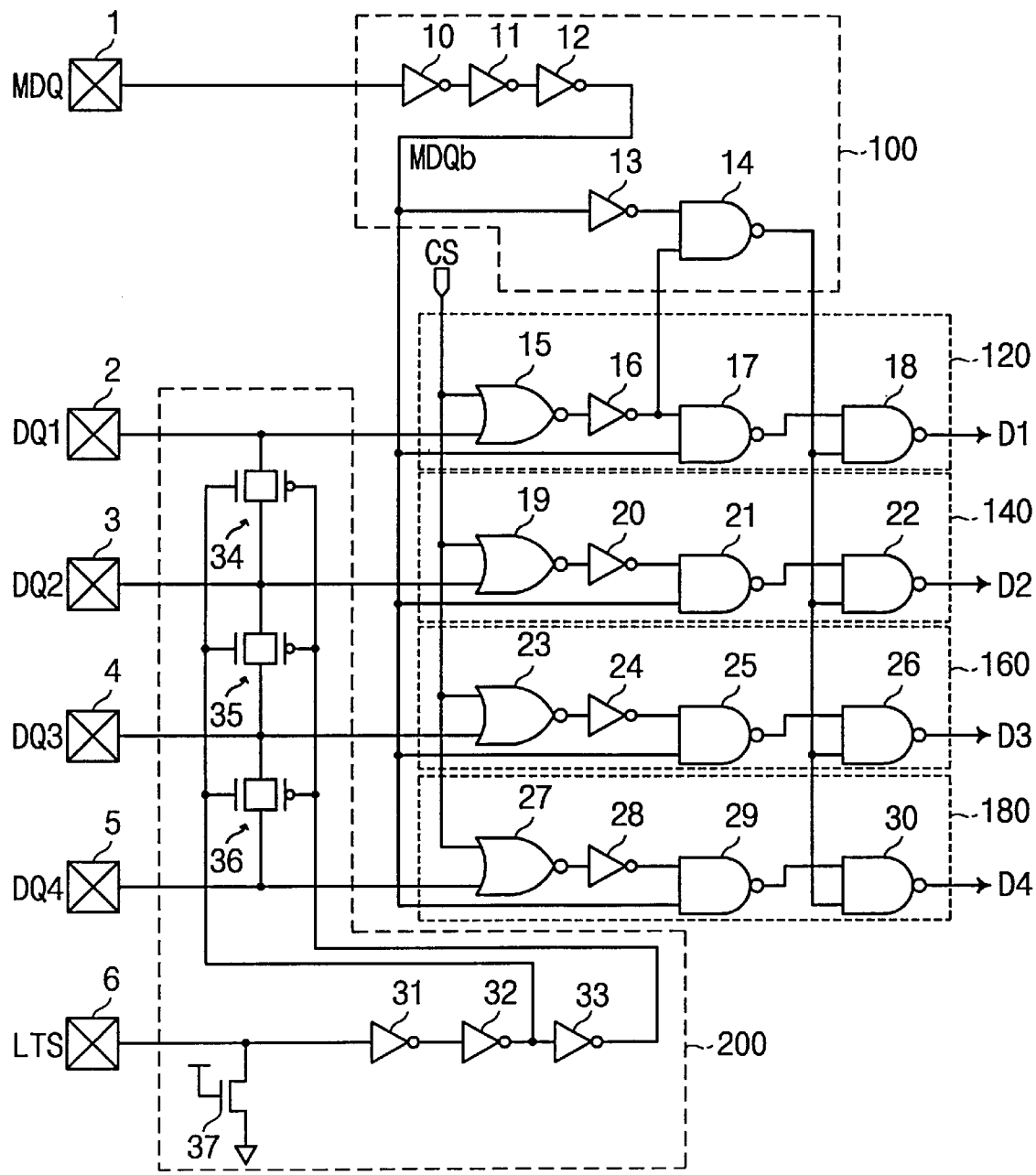

Referring to FIG. 2, a parallel test circuit for a semiconductor memory device according to one embodiment of the present invention includes a switching circuit 200 which, in a parallel testing mode of the circuit, connects all of the data input pads 2, 3, 4 and 5 to one another so that a current leakage in any one of the data input buffers 120, 140, 160 and 180 respectively associated with the data input pads 2, 3, 4 and 5 can be simultaneously detected. Thus, since no additional tests for current leakage are required, total test time for the device is desirably reduced, compared to the time necessary to test for leakage currents one pad at a time.

Figure 1:
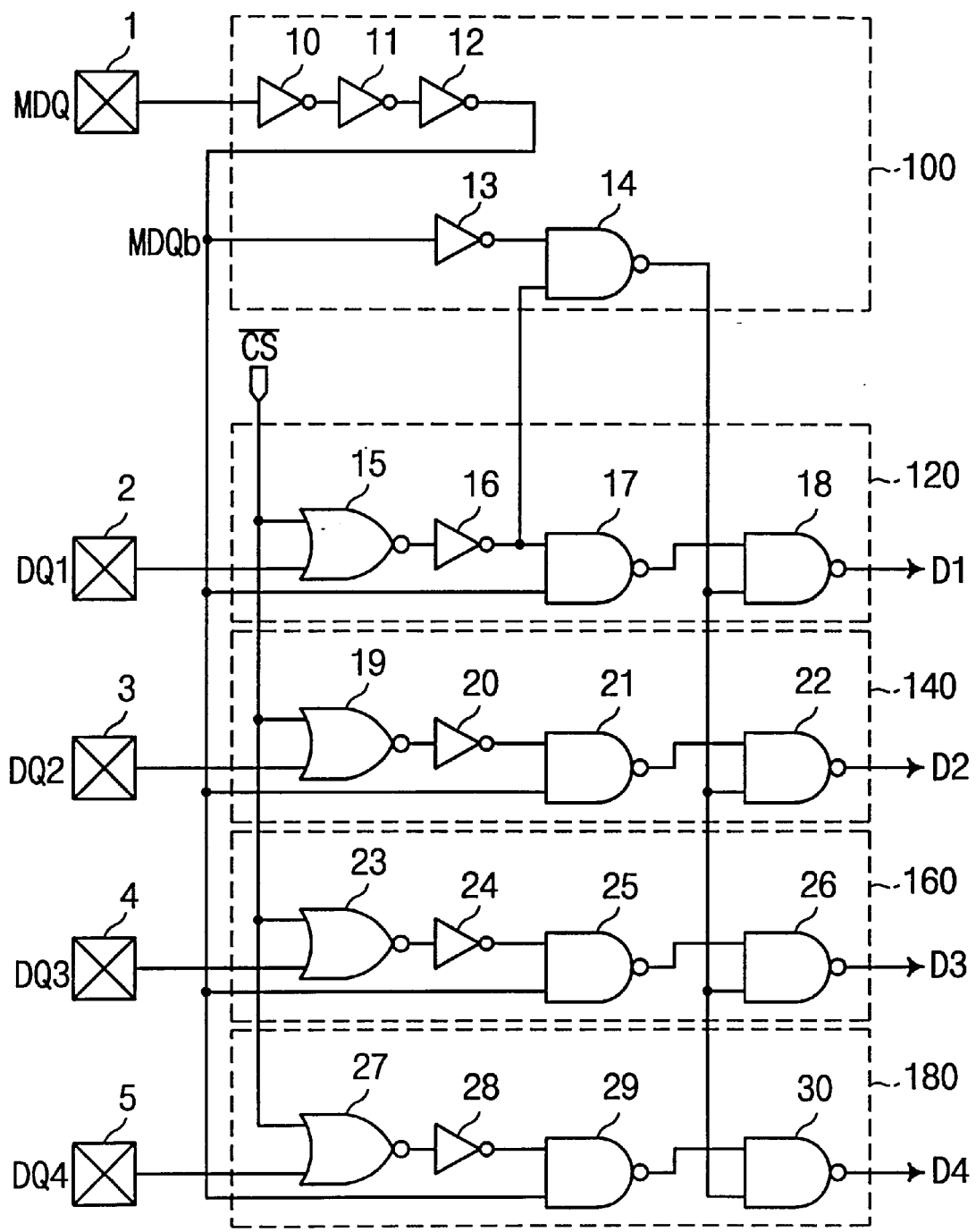
FIG. 1 is a schematic diagram of a conventional, or prior art, parallel test circuit for a semiconductor memory device; and, FIG. 2 is a schematic diagram of a parallel test circuit in accordance with an embodiment of the present invention.

The novel parallel test circuit of FIG. 2 includes a parallel test pad 1, four data input pads 2, 3, 4 and 5, a leakage test pad 6, a parallel test control circuit 100, four data input buffers 120, 140, 160 and 180, and a switching circuit 200. The test control circuit 100 and data input buffers 120, 140, 160 and 180 all operate in the same manner as their counterparts described above in connection with FIG. 1. The leakage test pad 6 can be used in a wafer-level test of the device, and if appropriately connected to an input/output pin of the packaged device, in a package-level test of the device as well.

Switching circuit 200 includes three inverters 31, 32 and 33, three transmission gates 34, 35 and 36, and an additional NMOS transistor 37. The transmission gates 34, 35 and 36 may each comprise a PMOS and an NMOS transistor, each with a gate serving as an input terminal. Transmission gates 34, 35 and 36, when activated, act like closed switches to define a current path between adjacent pairs of data input pads 2-3, 3-4 and 4-5, respectively. The non-inverting control terminals of transmission gates 34, 35 and 36 are connected to the output of inverter 32, and the other, inverting control terminals of the transmission gates 34, 35 and 36 are connected to the output of inverter 33. Thus, when transmission gates 34, 35 and 36 are activated, or closed, all of the data input pads 2, 3, 4 and 5 are electrically connected to each other through the transmission gates.

As seen in FIG. 2, the NMOS transistor 37 has a current path between the leakage test pad 6 and ground, and the gate of NMOS transistor 37 is supplied with a source voltage. Thus, during normal operation of the device, unless a high level leakage test enable signal (LTS) is being applied to leakage test pad 6, the transistor 37 shunts all other signals on test pad 6 to ground, thereby deactivating transmission gates 34, 35 and 36 and isolating pads 2–5 from each other for normal operation.

Switching circuit 200 makes it possible to simultaneously perform a current leakage test of a memory device during a parallel data writing test of the device. In this augmented test, data of a high level is inputted into, e.g., data input pad 2, as described above. Simultaneously, a leakage test enable signal (LTS) of high level is applied to leakage test pad 6. In response to the high level LTS input to pad 6, the inverters 31–33 shift the control inputs of transmission gates 34, 35 and 36, causing the gates to close and to electrically connect all of the data input pads 2, 3, 4 and 5 to each other. If a current leakage path exists in, for example, data input buffer 180, a leakage current will pass from data input pad 2 through transmission gates 34, 35 and 36 to data input buffer 180. Thus, a current leakage of data input buffer 180, which is associated with data input pad 5, and not with data input pad 2, will nevertheless be detected during the parallel data writing test. Further, a current leakage in any of the remaining data input buffers 120, 140 and 160 will likewise be simultaneously detected during the parallel data writing test, thus eliminating the need to test them one at a time.

Those skilled in the art will by now recognize that, depending on the particular problem at hand, certain advantageous modifications and substitutions can be made to the circuits and methods of the present invention without departing from its scope. Accordingly, the particular embodiments described and illustrated herein should be considered as exemplary in nature, and not as limitations of that scope, which is defined only by the claims appended hereafter.

What is claimed is:

1. A test circuit for a semiconductor device, comprising:
   a plurality of data input pads;
   a plurality of data input buffers connected to respective ones of the data input pads to receive input data applied to the data input pads in response to a chip selection signal during normal operation of the device, and to generate output data in response thereto; and,
   a switching circuit for electrically connecting the data input pads to each other in response to a current leakage test signal applied to the circuit.

2. The test circuit of claim 1, wherein the switching circuit further comprises:
   a current leakage test pad which receives the current leakage test signal;
   a buffer connected to the current leakage test pad;
   an inverter which inverts an output of the buffer; and,
   a plurality of transmission gates which electrically connects adjacent data input pads to each other in response to the current leakage test signal, the transmission gates each including a first and a second control terminal, the first and second control terminals being respectively controlled by an output of the buffer and an output of the inverter.

3. The test circuit of claim 2, wherein each of the transmission gates includes an NMOS transistor with a gate serving as the first control terminal, and a PMOS transistor with a gate serving as the second control terminal.

4. The test circuit of claim 2, wherein the switching circuit includes an NMOS transistor having a current path between the current leakage test pad and a ground, and wherein a gate of the NMOS transistor is supplied with a source voltage.

5. The test circuit of claim 1, wherein data is applied to the input pad of a selected one of the data input buffers, thereby causing it to generate output data of a given level, and further comprising:
   a parallel test pad for receiving a parallel test active signal; and,
   a parallel test control circuit connected to the parallel test pad and responsive to the test active signal to cause the unselected ones of the data input buffers to generate output data of the same level as the output data generated by the selected one of the data input buffers.

6. A test circuit for a semiconductor memory device, comprising:
   a plurality of data input pads;
   a plurality of data input buffers respectively connected to the data input pads for receiving input data from the input pads and for generating output data in response thereto;

a parallel test pad for receiving a parallel test active signal;

a parallel test control circuit connected to the parallel test pad for controlling the data input buffers such that, in response to the parallel test active signal and an input of data to a selected one of the input data buffers, the unselected ones of the data input buffers generate output data of the same level as that generated by the selected one of the data input buffers; and, a switching circuit for electrically connecting the data input pads to each other in response to a current leakage test signal.

* * * * *